(12) United States Patent
Tsuji

(10) Patent No.: US 7,302,175 B2
(45) Date of Patent: Nov. 27, 2007

(54) LENS BARREL FOR CAMERA

(75) Inventor: Kanji Tsuji, Ohta-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 377 days.

(21) Appl. No.: 11/136,895

(22) Filed: May 25, 2005

(65) Prior Publication Data
US 2005/0265716 A1    Dec. 1, 2005

(30) Foreign Application Priority Data
May 26, 2004    (JP)    ............... 2004-156360

(51) Int. Cl.
*G03B 7/26*    (2006.01)
(52) U.S. Cl. ............. 396/542; 396/535; 396/303; 396/428
(58) Field of Classification Search ............. 396/542
See application file for complete search history.

(56) References Cited

U.S. PATENT DOCUMENTS

| 5,717,969 | A | | 2/1998 | Miyamoto et al. |
| 5,970,259 | A | * | 10/1999 | Higuchi ............... 396/79 |
| 2006/0159438 | A1 | * | 7/2006 | Kobayashi ............ 396/79 |

FOREIGN PATENT DOCUMENTS

| JP | 5-061739 A | 3/1993 |
| JP | 7-181360 A | 7/1995 |

* cited by examiner

*Primary Examiner*—Patrick Assouad
*Assistant Examiner*—Nia Cook

(57) ABSTRACT

Flexible printed boards are introduced to a camera body respectively through a plurality of slit holes formed in a rotating barrel at different positions in the direction of an optical axis. The outer dimension of the lens barrel is kept from increasing.

5 Claims, 17 Drawing Sheets

TELE

WIDE

STORAGE POSITION
(RETRACTED END)

TELE

WIDE

STORAGE POSITION
(RETRACTED END)

LENS BARREL FOR CAMERA

BACKGROUND OF THE INVENTION

1. Field of the Invention

The present invention relates to a lens barrel for a camera, and more particularly to a mounting structure of a flexible printed board which is mounted in a lens barrel for a camera.

2. Description of the Related Art

FIG. 16 is a schematic sectional view showing a mounting structure of a flexible printed board (also referred to as a "flexible board") for electrically connecting, to a camera body, a shutter, a diaphragm, a focusing mechanism, etc., which are disposed within a known retracting zoom lens barrel, and FIG. 17 is a schematic view of the zoom lens barrel from the front side.

Referring to FIG. 16, the zoom lens barrel comprises a first group unit 101 and a second group unit 102. A shutter and diaphragm unit 103 is attached to the second group unit 102. A rectilinearly moving barrel 104 guides the first group unit 101 and the second group unit 102 in the direction of an optical axis. A cam barrel 105 has cam grooves 105a, 105b, and a stationary barrel 106 has a cam groove 106a, a through hole 106b and a slit hole 106c. The holes 106b, 106c are each extended along a similar locus to that of the cam groove 106a. A rotating barrel 107 has a rectilinear groove 107a and a slit hole 107b. Other components include a cover member 108 having a slit hole 108a, a base member 109, a first-group cam follower 110 attached to the first group unit 101, a second-group cam follower 111, a cam barrel follower 112, and a driving pin 113. A flexible board 114 is connected at one end to the shutter and diaphragm unit 103 and at the other end to a flexible board (not shown) on the body side through the slit holes 106c, 107b and 108a.

In the structure described above, when the rotating barrel 107 is rotated by a driving source (not shown), the rotation of the rotating barrel 107 is transmitted from the rectilinear groove 107a to the driving pin 113. Correspondingly, the cam barrel 105 is moved in the direction of the optical axis while rotating along the cam groove 106a, because the cam groove 106a and the cam barrel follower 112 are engaged with each other. With the rotation of the cam barrel 105, the first group unit 101 and the second group unit 102 are also moved in the direction of the optical axis along the cam grooves 105a, 105b, respectively. At this time, the rotating barrel 107 is rotated by a predetermined angle from a retracted position to a position in the WIDE-TELE zoom region. As shown in FIG. 17, the slit hole 107b of the rotating barrel 107 through which the flexible board 114 passes is formed over a circumferential distance corresponding to the angle by which the rotating barrel 107 is rotatable.

The above-described mounting structure of the flexible board for electrically connecting the shutter and diaphragm unit 103, which is disposed within the retracting zoom lens barrel, to the camera body is generally employed with the purpose of minimizing the amount of slack by which the flexible board is loosened into an inner space of the lens barrel when the lens barrel is extended out (i.e., a purpose of eliminating vignetting caused on internal reflection and an effective optical path by the slack of the flexible board in a shooting state).

However, in a lens barrel of the type wherein other units requiring electrical connection to the camera body, such as a focusing unit and an anti-shaking unit, are also attached to the second group unit 102 within the lens barrel in addition to the shutter and diaphragm unit 103, the above-described known structure has disadvantages in that the width (indicated by a in FIG. 17) of the flexible board is increased and the outer dimension of the lens barrel is enlarged. When the flexible board is divided into two parts and each board is mounted with the above-described known structure, the angle (indicated by b in FIG. 17) of the slit hole is increased two folds corresponding to the divided two flexible boards. Therefore, the strength of the rotating barrel 107 as one of the lens barrel components cannot be ensured at a sufficient level.

SUMMARY OF THE INVENTION

The present invention is directed to a lens barrel for a small-sized camera, which can ensure sufficient strength of a rotating barrel.

According to a first aspect of the present invention, a lens barrel for a camera including a camera body includes a rotating barrel having a plurality of slit holes defined at different positions, a plurality of lens groups having an optical axis; actuators attached to one of the plurality of lens groups, and a plurality of flexible printed boards electrically connecting the actuators to the camera body. The flexible printed boards are introduced to the camera body respectively through the plurality of slit holes in a direction of the optical axis.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
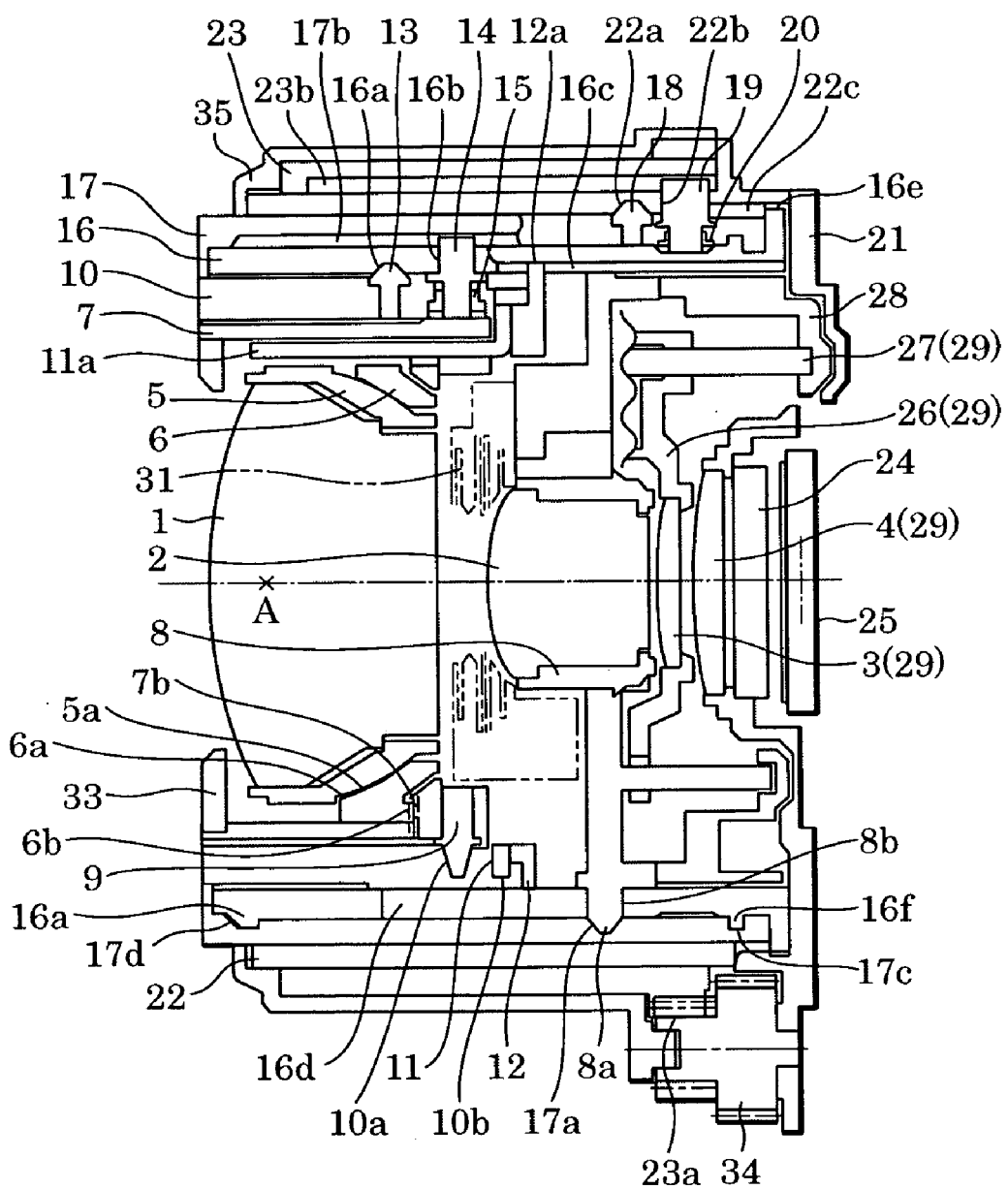
FIG. 1 is a sectional view of a zoom lens barrel in a storage position.
Figure 9:
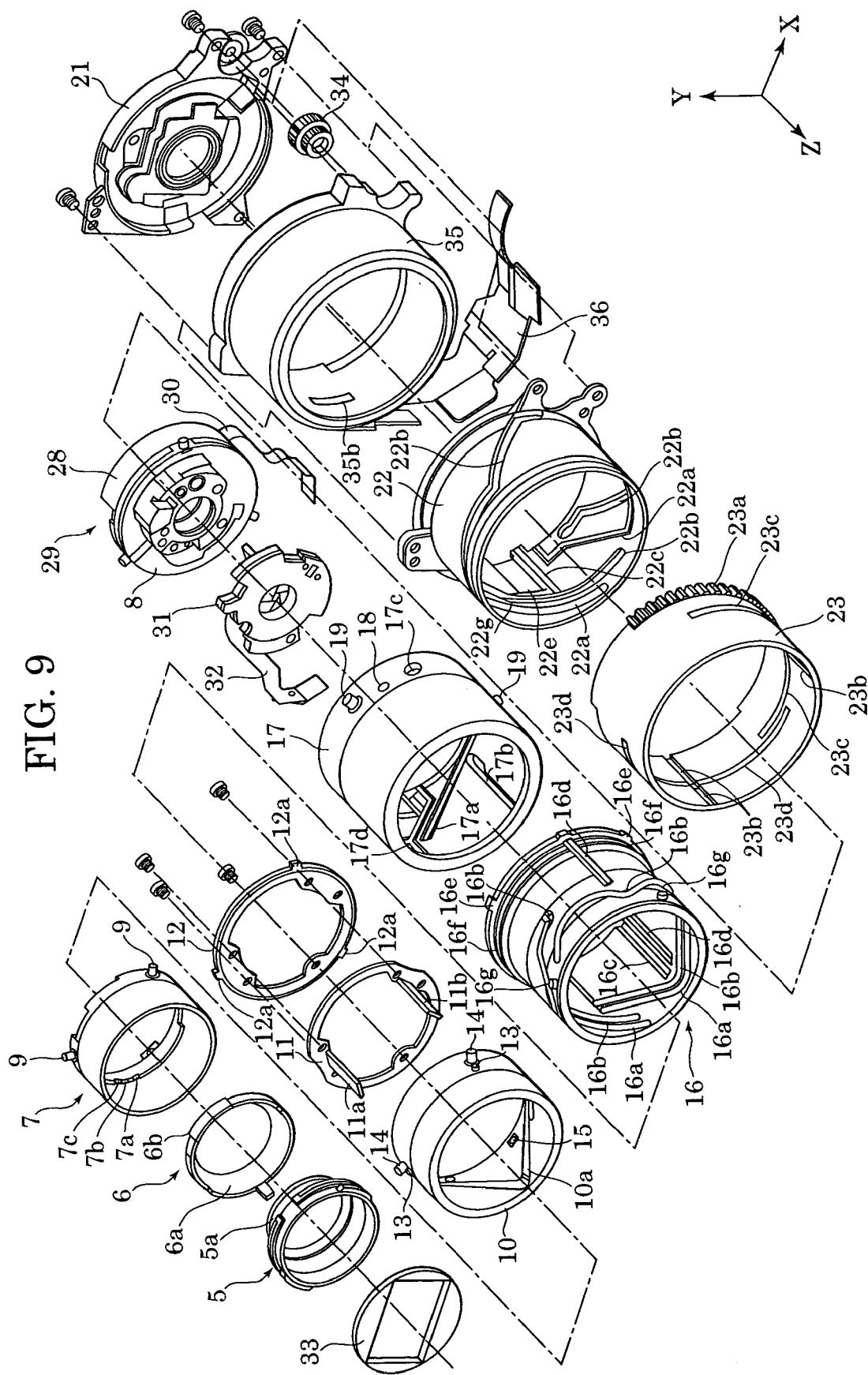
FIG. 9 is an exploded perspective view of the overall lens barrel.

FIG. 1 is a sectional view of a zoom lens barrel in a storage position according to one embodiment of the present invention, and FIG. 9 is an exploded perspective view of the overall lens barrel. A zoom lens includes a first lens group 1, a second lens group 2, a third lens group 3, and a fourth lens group 4. The first lens group 1 is held by a first lens group holder 5 having a spherical surface 5a about a rear principal point A of the first lens group 1. A first group moving member 6 is movable in the direction of an optical axis and holds the first lens group holder 5. The outer diameter of the first group moving member 6 and the inner diameter of a first group holding member 7 are selected such that the outer periphery of the former and the inner periphery of the latter are engaged with each other. The first group moving member 6 has a conical surface 6a in contact with the spherical surface 5a. The first group holding member 7 holds the first group moving member 6 and has stepped portions 7a, 7b and 7c formed at different positions in the direction of the optical axis. One of the stepped portions 7a, 7b and 7c contacts with a spherical portion 6b. A set of the spherical portion 6b and the stepped portions 7a, 7b and 7c is disposed in each of three locations at equal angular intervals of 120° in the rotating direction of the optical axis. After assembling the first group moving member 6 and the first lens group holder 5 to the first group holding member 7, the first lens group holder 5 and the first group holding member 7 are fixedly bonded to each other.

A second group holding member 8 holds the second lens group 2, and a first group cam follower 9 is fixedly pressed into the first group holding member 7. A first cam barrel 10 has a cam groove 10a formed in its inner surface for engagement with the first group cam follower 9. A rectilinearly moving member 11 has rectilinear movement guide portions 11a, 11b for guiding the first group holding member 7 in the direction of the optical axis and is engaged in a groove 10b of the first cam barrel 10 to prevent the member 11 from slipping-off. A ring member 12 has a projection 12a engaged in a rectilinear movement guide groove 16c of a second cam barrel 16 (described later) to guide the rectilinear movement of the ring member 12 in the direction of the optical axis while restricting the rotation thereof. The ring member 12 is fixedly screwed to the rectilinearly moving member 11.

The rectilinearly moving member 11, the ring member 12, and the first cam barrel 10 can be assembled together at a predetermined phase with respect to the groove 10b such that they are rotatable as one unit.

A cam follower 13 is provided on the first cam barrel 10. A driving pin 14 is attached to the first cam barrel 10 and is engaged in a rectilinear groove 17b of a third cam barrel 17 (described later) to receive a driving force. A nut member 15 fixes the driving pin 14 to the first cam barrel 10. The second cam barrel 16 has a cam groove 16a formed in its inner surface for engagement with the cam follower 13, a cam hole 16b extending along a similar locus to that of the cam groove 16a to receive the driving pin 14 penetrating through it, the rectilinear movement guide groove 16c engaging with the projection 12a of the ring member 12 to guide the rectilinear movement of the ring member 12 while restricting the rotation thereof, a rectilinear movement guide portion 16d engaging with a rotation restricting portion 8b of the second group holding member 8 to guide the rectilinear movement of the second group holding member 8 in the direction of the optical axis, a projection 16e engaging in a rectilinear movement guide groove 22c of a stationary barrel 22 (described later) to guide the rectilinear movement of the second cam barrel 16 while restricting the rotation thereof, a projection 16f engaging in a groove 17c of the third cam barrel 17 (described later) for co-rotation with the third cam barrel 17 while preventing slipping-off, a projection 16g contacting with a groove 17d of the third cam barrel 17 to bear a force accidentally applied from the front side of lens barrel, and a through hole 16h (FIG. 10) in which the driving pin 14 is assembled.

The third cam barrel 17 has a cam groove 17a engaging with a cam follower 8a formed integrally with the second group holding member 8, the rectilinear groove 17b for transmitting rotation to the driving pin 14, the slipping-off preventive groove 17c into which the slipping-off preventive projection 16f of the second cam barrel 16 can be assembled at a predetermined phase, the groove 17d corresponding to the projection 16g of the second cam barrel 16, and a through hole 17e (FIG. 8) in which a pin member 19 (described later) is assembled.

A cam follower 18 is fixedly pressed into the third cam barrel 17. The pin member 19 is attached to the third cam barrel 17 and is engaged in a rectilinear groove 23b of a rotating barrel 23 (described later) to receive the driving force. A nut member 20 fixes the pin member 19 to the third cam barrel 17.

A base member 21 is attached to a camera body (not shown) and holds the fourth lens group 4.

The stationary barrel 22 is fixedly attached to the base member 21. Formed in an inner surface of the stationary barrel 22 are the cam groove 22a engaging with the cam follower 18, the cam hole 22b extending along a similar locus to that of the cam groove 22a and engaging with the pin member 19, and the rectilinear movement guide groove 22c engaging with the projection 16e of the second cam barrel 16, which serves to restrict the rotation of the second cam barrel 16. The stationary barrel 22 further has recesses 22d (FIG. 5), 22e and slit holes 22f (FIG. 5), 22g formed therein to allow passage of flexible boards 30, 32 (described later) from the interior of the lens barrel to the exterior.

The rotating barrel 23 has a gear portion 23a formed along an outer periphery thereof and the rectilinear groove 23b for transmitting rotation to the pin member 19. The rotating barrel 23 is rotatable about the optical axis around the stationary barrel 22. Slit holes 23c, 23d allowing passage of the flexible boards 30, 32 (described later) from the interior of the lens barrel to the exterior are formed in the rotating barrel 23 at different positions in the direction of the optical axis over a circumferential distance corresponding to a predetermined rotational angle of the rotating barrel 23. Further, the slits holes 23c, 23d are formed in overlapped relation to each other in the circumferential direction. An optical member 24 is fitted to the base member 21, and a CCD 25 is attached to the base member 21 in a manner not specifically shown. A third group holding member 26 holds the third lens group 3, and a third group guide member 27 guides the third group holding member 26 in the direction of the optical axis. A fixing member 28 serves to position and fix the third group guide member 27 in place. A focusing unit 29 (shown in FIG. 9) is constituted in a state where the third lens group 3, the third group holding member 26, the third group guide member 27, the fixing member 28, and a driving unit (not shown) are assembled in the second group holding member 8. The flexible board 30 is soldered to a connecting portion of the driving unit (not shown) of the focusing unit 29. A diaphragm and shutter unit 31 is attached to the second group holding member 8. The flexible board 32 is soldered to a connecting portion (not shown) of the diaphragm and shutter unit 31.

A first group cap member 33 is attached to the first group holding member 7, and a gear member 34 transmits the rotation of the driving unit (not shown) to the gear portion 23a of the rotating barrel 23. A cover member 35 is fixedly screwed to both the base member 21 and the stationary barrel 22 to form an integral assembly, and it has slit holes 35a, 35b formed therein to allow passage of the flexible boards 30, 32 from the interior of the lens barrel to the exterior. A connecting member 36 is used for connection of the flexible boards 30, 32 and is connected to a connecting portion of the camera body (not-shown).

Figure 4:
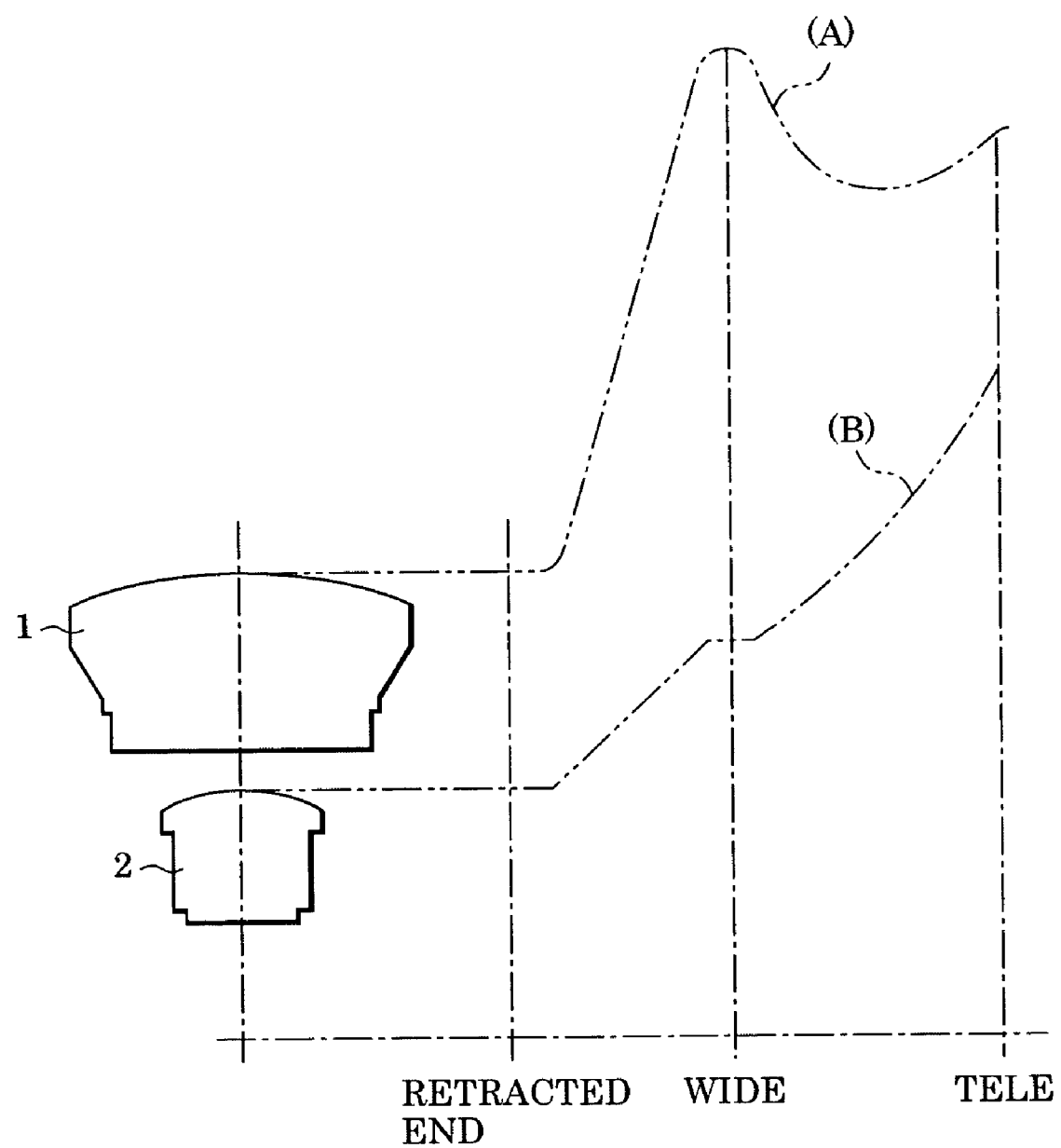
FIG. 4 shows respective loci of a first lens group and a second lens group in optical layout along which they are moved.

FIG. 4 shows respective loci of the first lens group and the second lens group in optical layout along which they are moved.

Figure 10:
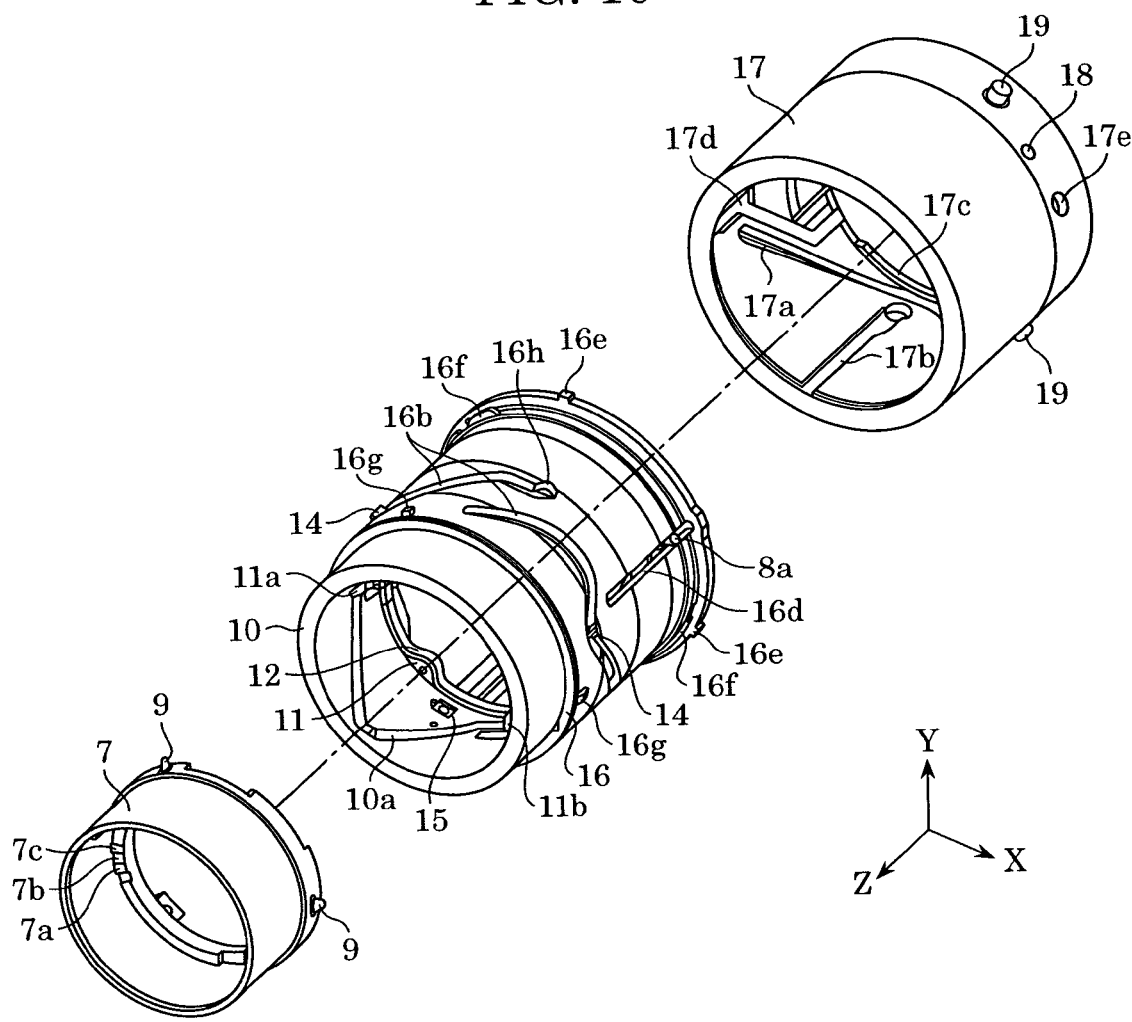
FIG. 10 is a perspective view showing a state where the first cam barrel, a rectilinearly moving member, a ring member, and a second group holding member are assembled to the second cam barrel.
Figure 11:
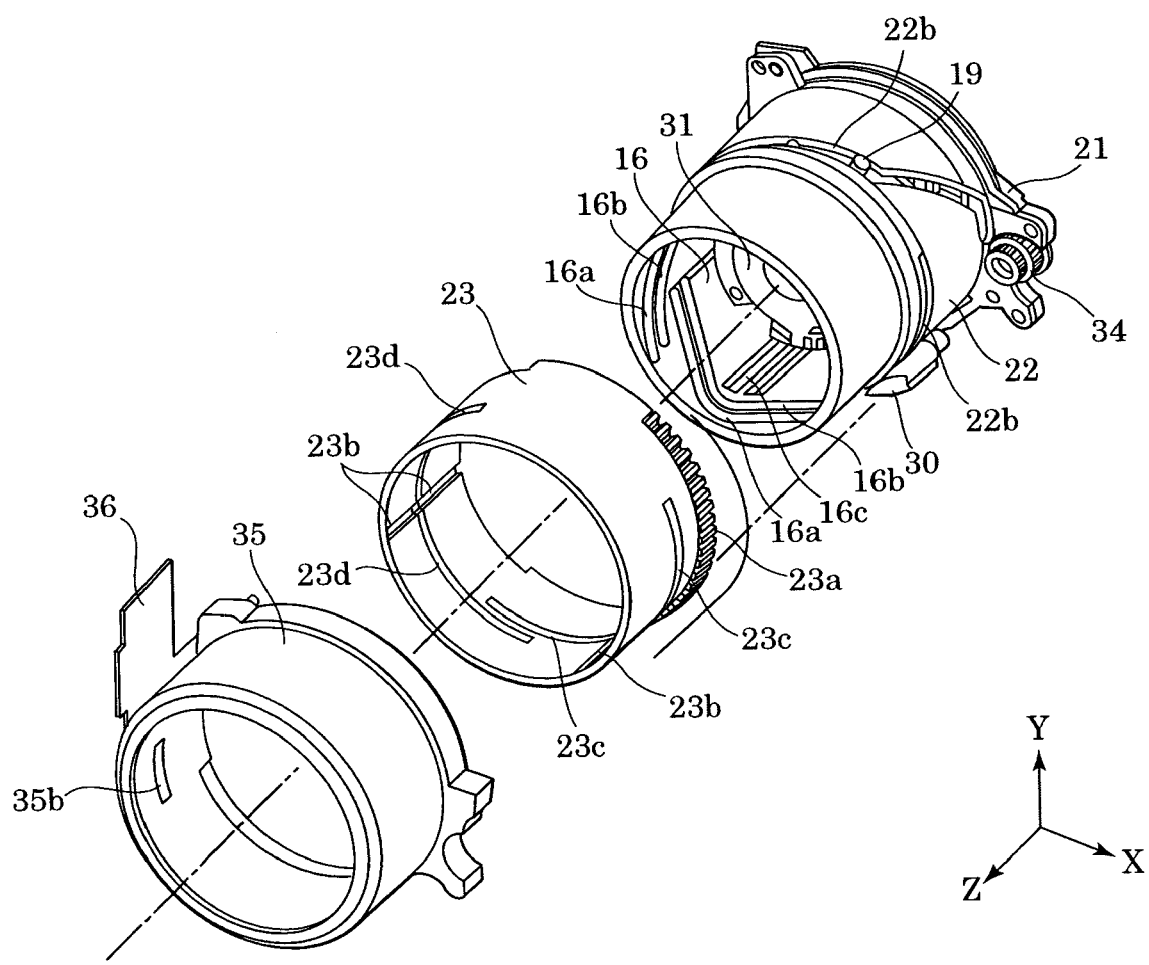
FIG. 11 is a perspective view showing a state where the third cam barrel and the second cam barrel are assembled to the stationary barrel.

FIG. 10 is a perspective view showing a state where the first cam barrel 10, the rectilinearly moving member 11, the ring member 12, and the second group holding member 8 are assembled to the second cam barrel 16. FIG. 11 is a perspective view showing a state where the third cam barrel 17 and the second cam barrel 16 are assembled to the stationary barrel 22.

Figure 2:
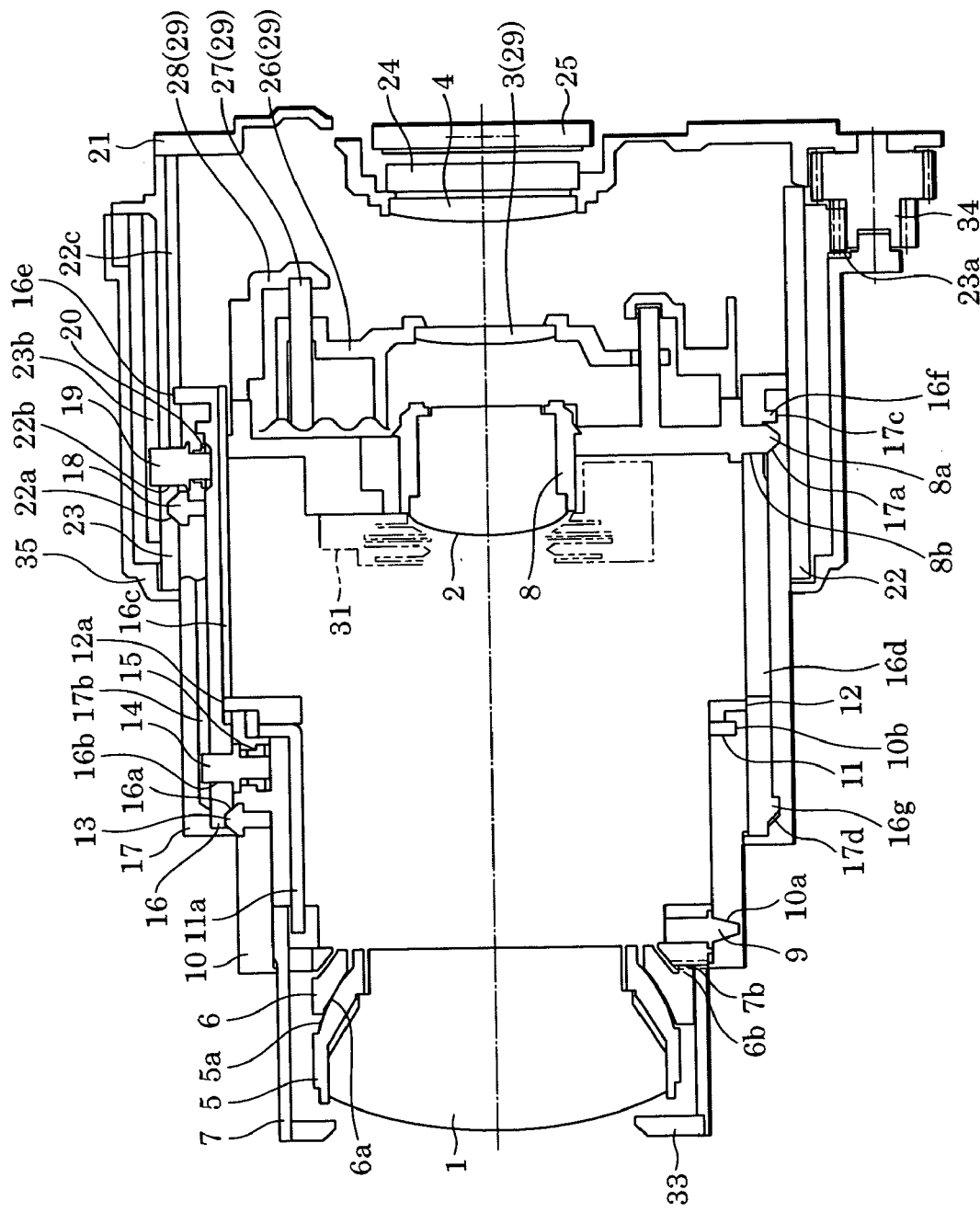
FIG. 2 is a sectional view of the zoom lens barrel in a WIDE position.
Figure 3:
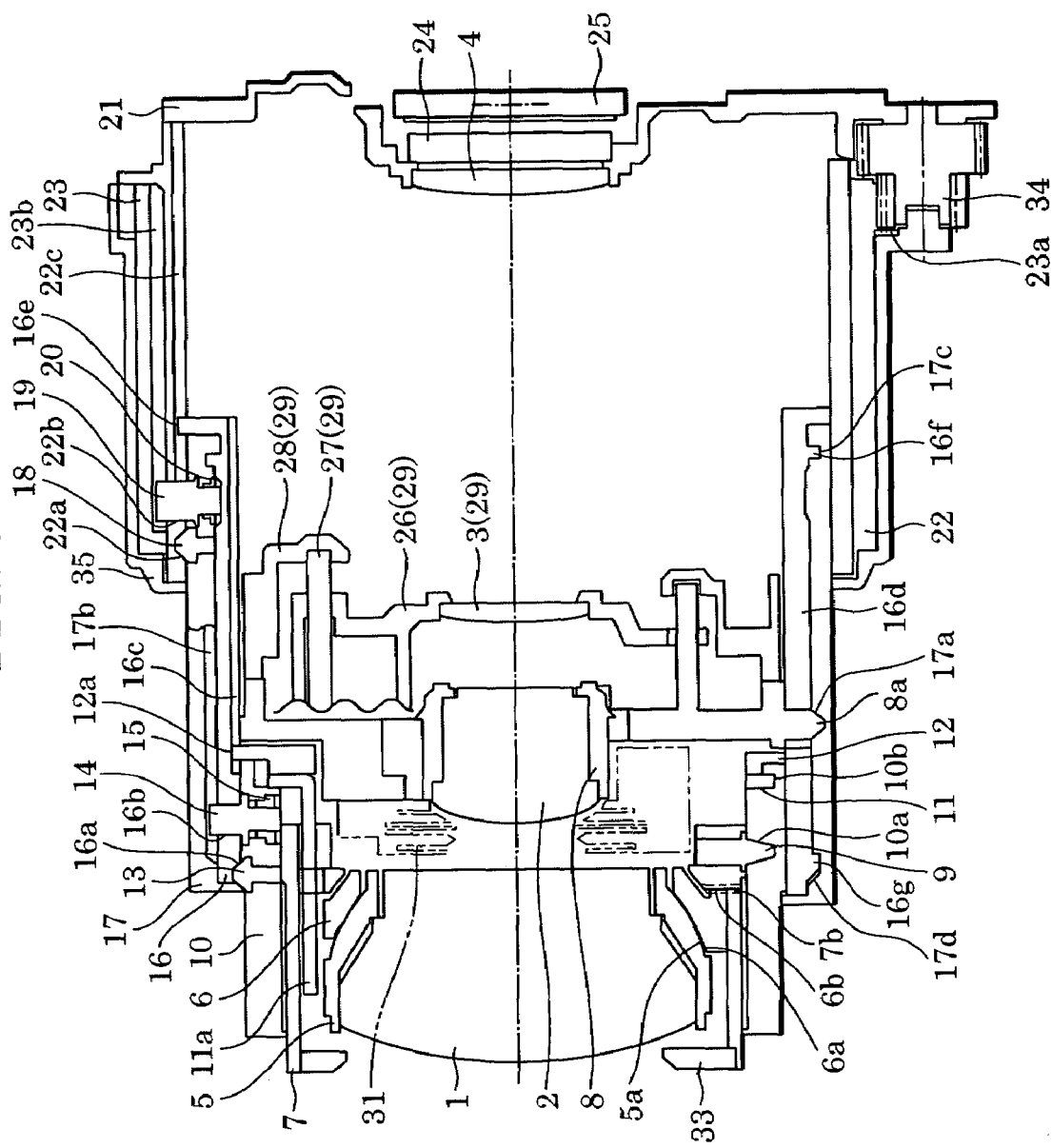
FIG. 3 is a sectional view of the zoom lens barrel in a TELE position.

A description is made of the retracting and advancing operation of the thus-constructed lens barrel for movement to a storage position (FIG. 1), a WIDE position (FIG. 2), and a TELE position (FIG. 3).

First, when the rotation from the driving unit (not shown) is transmitted to the gear member 34 and then the gear portion 23a of the rotating barrel 23 to rotate the rotating barrel 23, the third cam barrel 17 is rotated because the pin member 19 penetrating through the cam hole 22b of the stationary barrel 22 is engaged in the rectilinear groove 23b of the rotating barrel 23.

Figure 5:
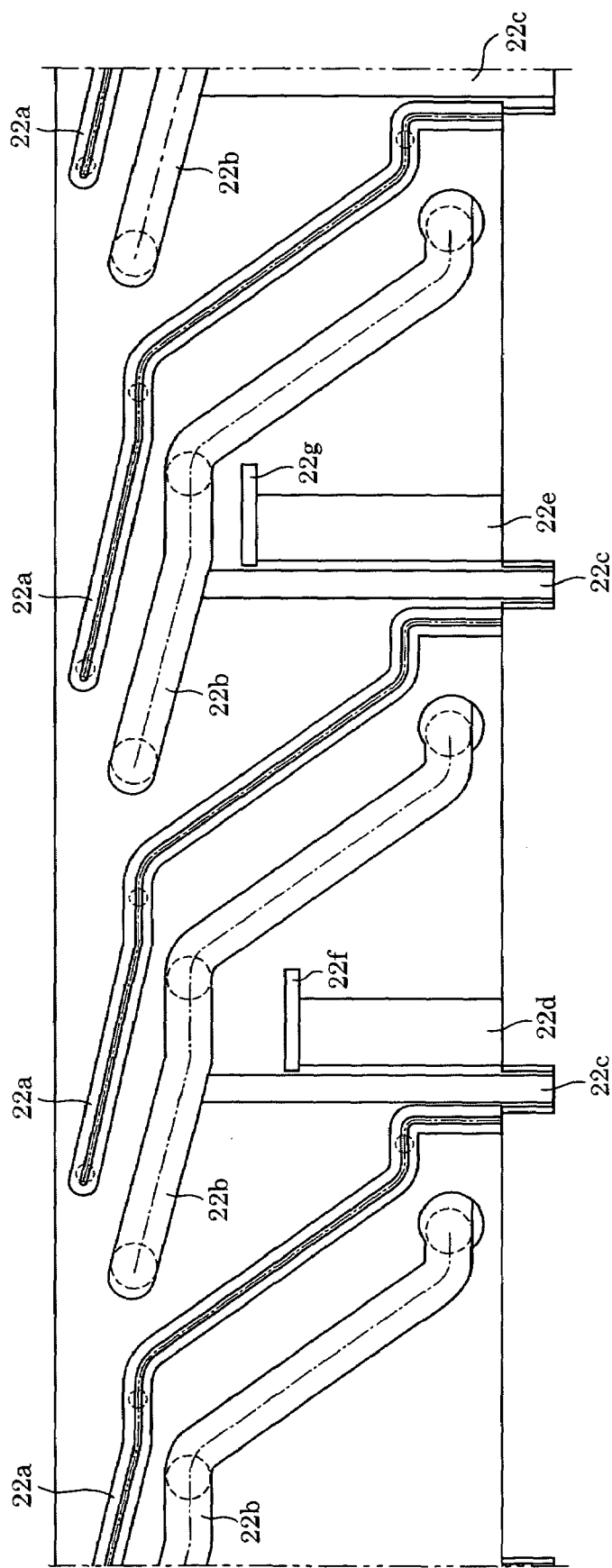
FIG. 5 is a development view of an inner surface of a stationary barrel.

Here, three pairs of nonlinear cam grooves 22a engaging with the cam followers 18 and nonlinear cam holes 22b are formed in the inner surface of the stationary barrel 22 (as shown in FIG. 5). Therefore, the third cam barrel 17 is moved in the direction of the optical axis along the cam locus while rotating through the engagement between the cam followers 18 and the cam grooves 22a. The second cam barrel 16 is also moved in the direction of the optical axis together with the third cam barrel 17 (see FIG. 11) while the second cam barrel 16 is prevented from slipping off by the engagement of the projection 16f in the groove 17c and is restricted from rotating by the engagement of the projection 16e in the rectilinear movement guide groove 22c of the stationary barrel 22.

Figure 6:
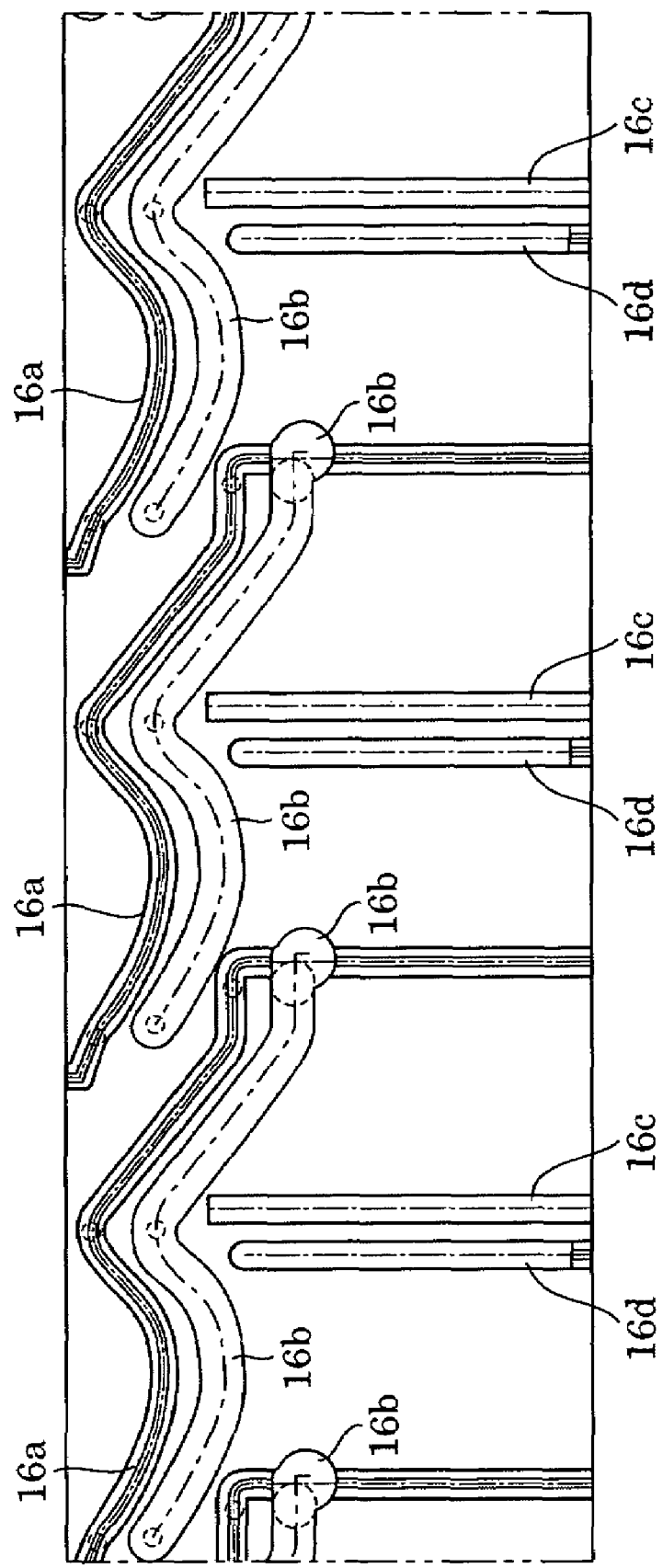
FIG. 6 is a development view of an inner surface of a second cam barrel.

More specifically, three pairs of nonlinear cam grooves 16a, engaging with the cam followers 13 and the nonlinear cam holes 16b, are formed in the inner surface of the second cam barrel 16 (as shown in FIG. 6), and the pin member 14 penetrating through the cam hole 16b is engaged in the rectilinear groove 17b of the third cam barrel 17. With the rotation of the third cam barrel 17, therefore, the first cam barrel 10 is moved in the direction of the optical axis along the cam locus while rotating through the engagement between the cam followers 13 and the cam grooves 16a (see FIG. 10).

At this time, the rectilinearly moving member 11 and the ring member 12, which are fixedly screwed to each other, are rectilinearly moved in the direction of the optical axis together with the first cam barrel 10 while they are restricted from rotating by the engagement of the rectilinear groove 16c with the projection (rotation restricting portion) 12a and are prevented from slipping off by the engagement of the ring member 12 in the groove 10b.

Figure 7:
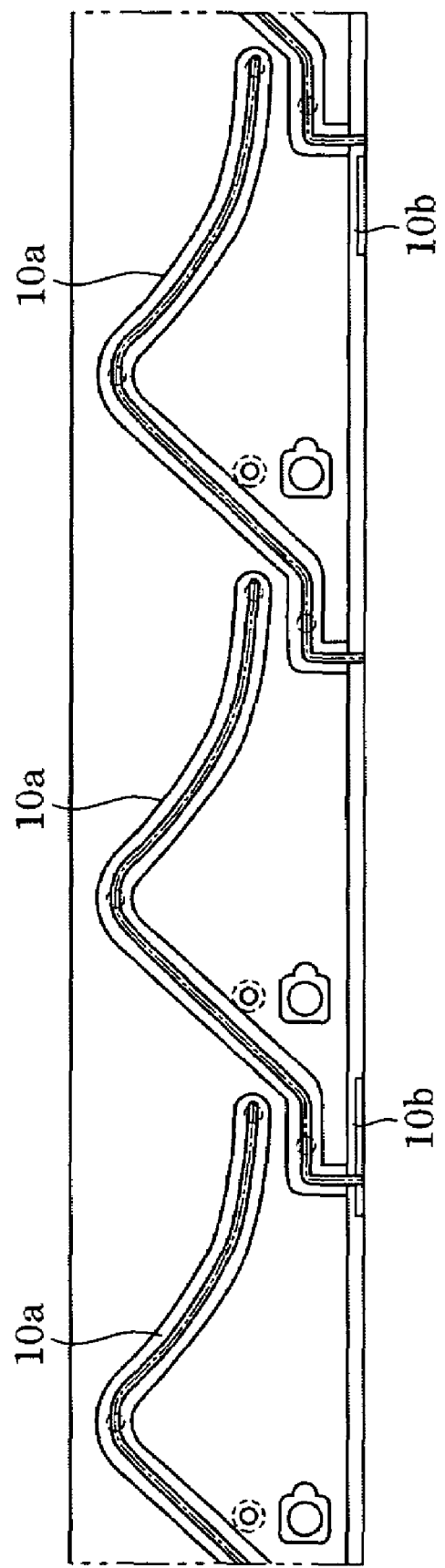
FIG. 7 is a development view of an inner surface of a first cam barrel.

When the first cam barrel 10 is rotated, the first group holding member 7 is moved in the direction of the optical axis with the rotation of the first cam barrel 10 because three non-linear cam grooves 10a engaging with the first group cam followers 9 are formed in an inner surface of the first cam barrel 10 (as shown in FIG. 7). At this time, the first group holding member 7 is restricted from rotating by the rectilinear movement guide portions 11a, 11b of the rectilinearly moving member 11 so that the first group holding member 7 is rectilinearly moved in the direction of the optical axis.

Thus, the first group holding member 7 (i.e., the first lens group 1) is optionally moved to the storage position, the WIDE position, and the TELE position in a retracting and advancing manner along a resultant cam locus A (FIG. 4) of the respective loci of the cam groove 22a, the cam groove 16a, and the cam groove 10a.

Figure 8:
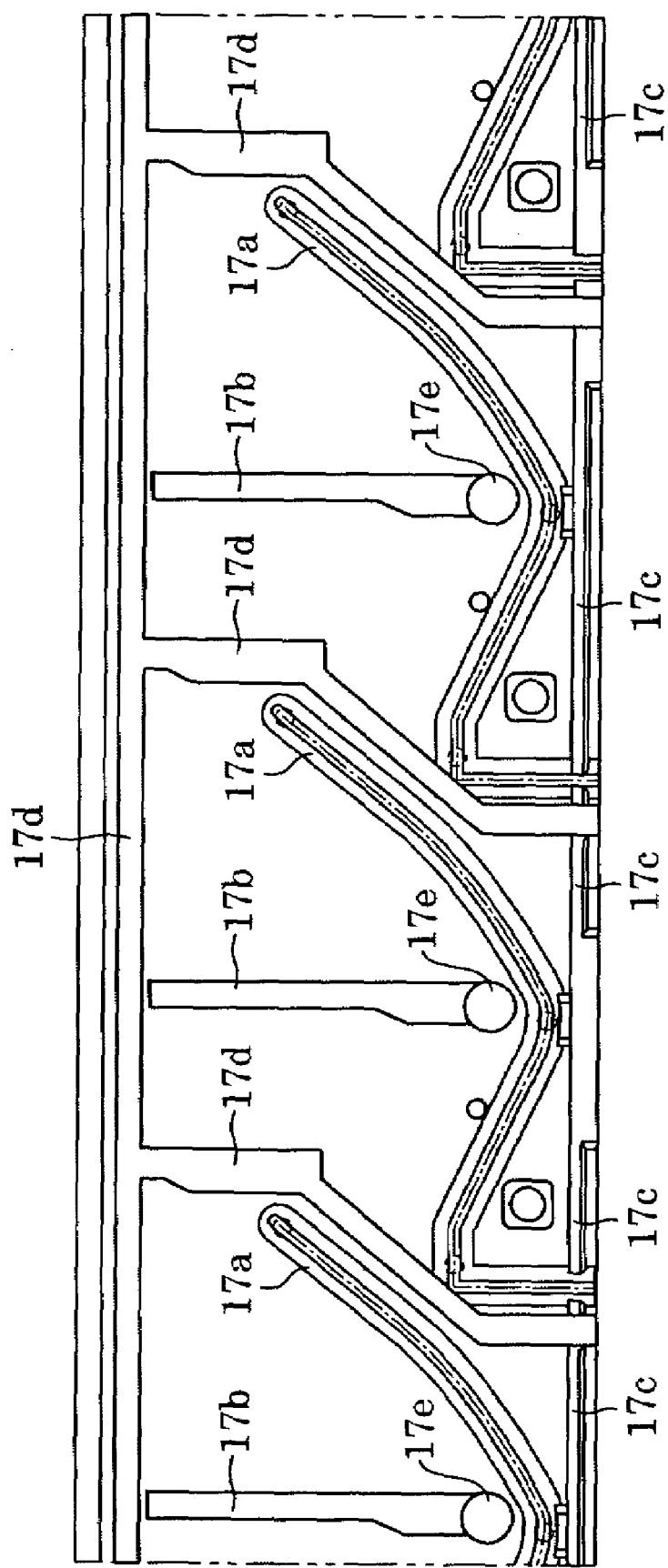
FIG. 8 is a development view of an inner surface of a third cam barrel.

Three non-linear cam grooves 17a engaging with the cam followers 8a are formed in an inner surface of the third cam barrel 17 (as shown in FIG. 8). With the rotation of the third cam barrel 17, therefore, the second group holding member 8 is moved in the direction of the optical axis by the engagement between the cam followers 8a and the cam grooves 17a formed in the third cam barrel 17.

At this time, the second group holding member 8 is rectilinearly moved in the direction of the optical axis because it is restricted from rotating by the engagement of the rectilinear groove 16d of the second cam barrel 16 with the rotation restricting portion 8b.

Thus, the second group holding member 8 (i.e., the second lens group 2) is optionally moved to the storage position, the WIDE position, and the TELE position in a retracting and advancing manner along a resultant cam locus B (FIG. 4) of the respective loci of the cam groove 22a and the cam groove 17a.

The third group holding member 26 is retracted and advanced in unit with the second group holding member 8. Further, the third group holding member 26 is additionally movable in the direction of the optical axis by the driving unit (not shown) attached to the second group holding member 8 such that it is moved a predetermined distance depending on the zoom position.

Figure 12A:
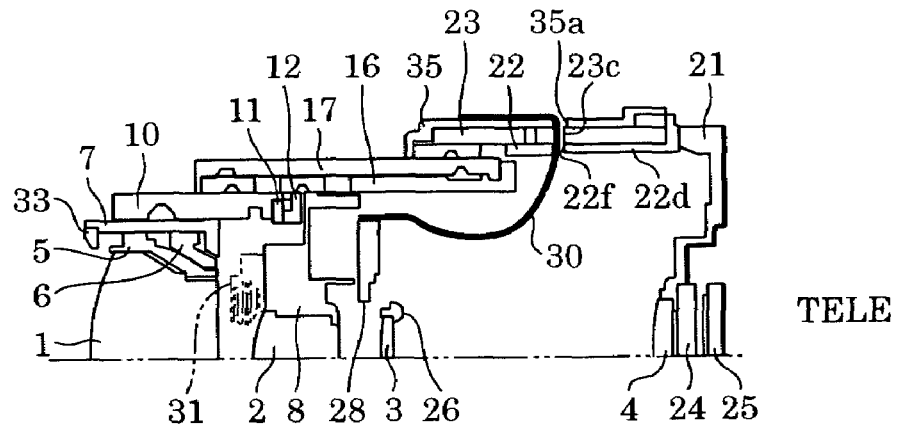
FIGS. 12A, 12B and 12C are schematic sectional views showing a flexible board (connected to a focusing unit) in the zoom lens barrel respectively at the TELE position, the WIDE position, and the storage position.
Figure 12B:
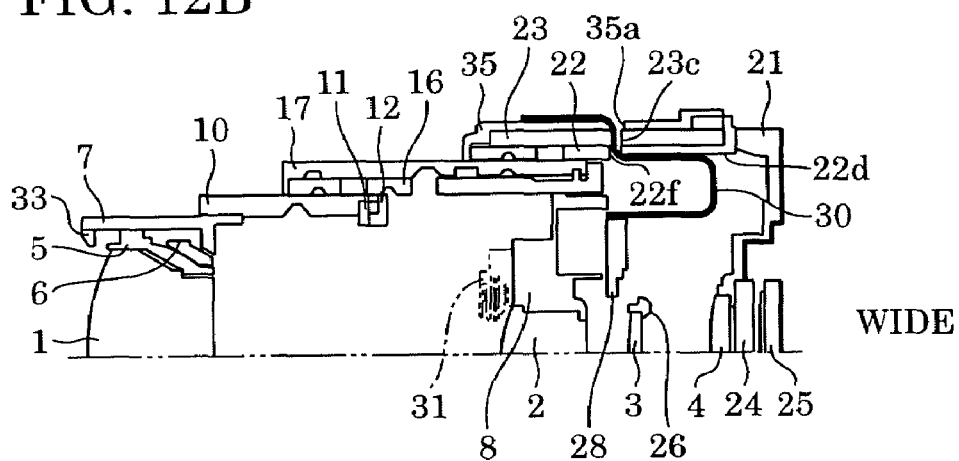
Figure 12C:
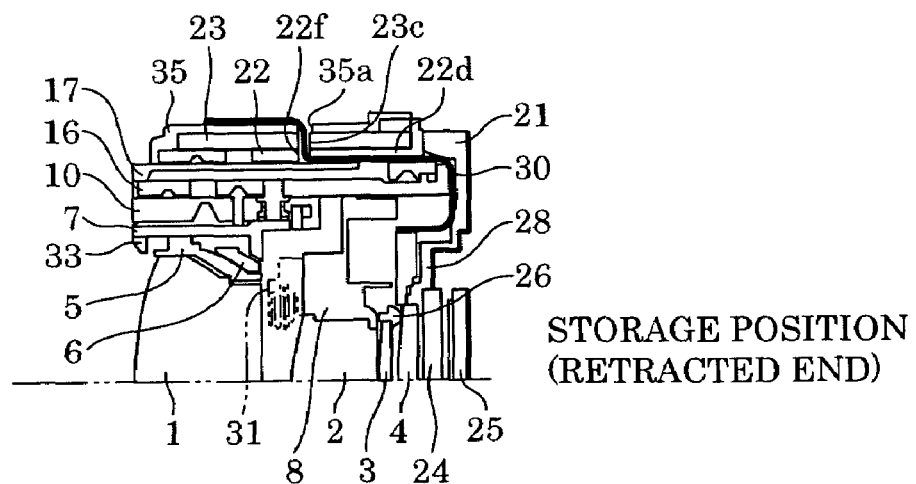

The mounting structure of the flexible boards 30, 32 will be described below. FIGS. 12A, 12B and 12C are schematic sectional views showing the flexible board 30 (connected to the focusing unit 29) in the zoom lens barrel of this embodiment respectively at the TELE position, the WIDE position, and the storage position. At the storage position, as shown in FIG. 12C, the flexible board 30 is disposed to extend through a gap between an outer periphery of the third cam barrel 17 and the recess 22d in the inner surface of the stationary barrel 22. The flexible board 30 is introduced to the exterior of the lens barrel unit while passing the slit hole 22f formed in the stationary barrel 22, the slit hole 23c formed in the rotating barrel 23, and the slit hole 35a formed in the cover member 35.

Figure 13A:
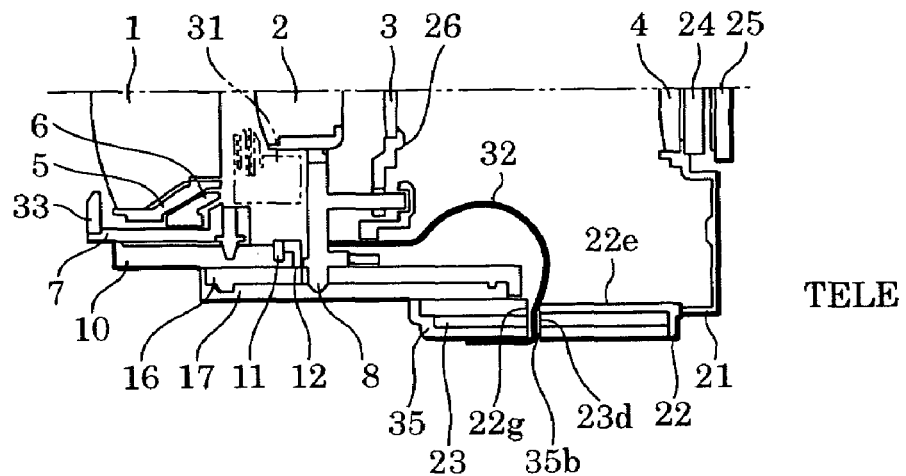
FIGS. 13A, 13B and 13C are schematic sectional views showing a flexible board (connected to a diaphragm and shutter) in the zoom lens barrel respectively at the TELE position, the WIDE position, and the storage position.
Figure 13B:
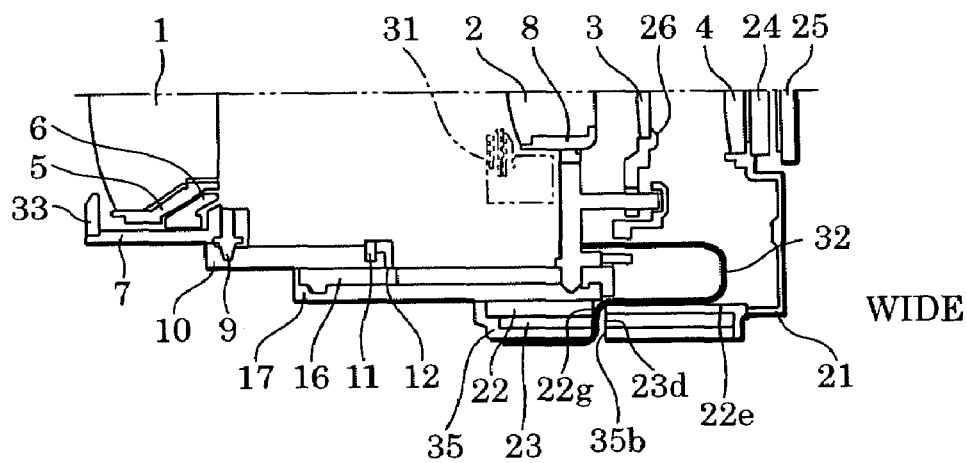
Figure 13C:
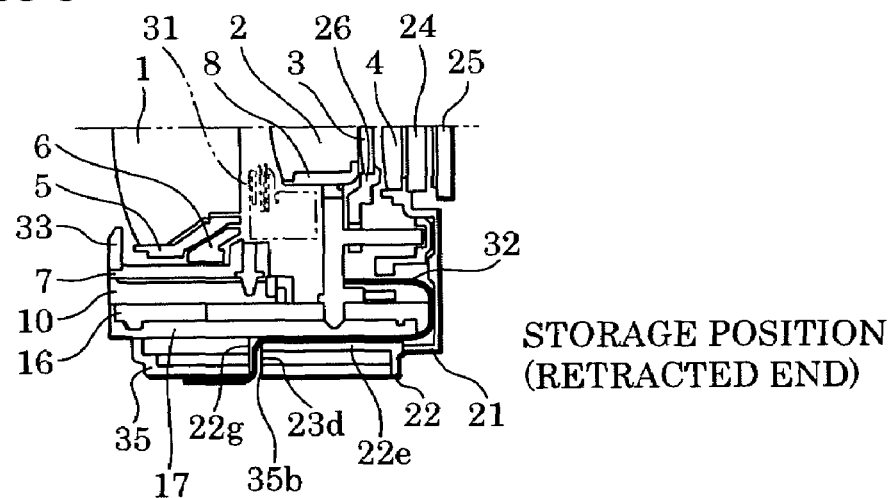

FIGS. 13A, 13B and 13C are schematic sectional views showing the flexible board 32 (connected to the diaphragm and shutter unit 31) in the zoom lens barrel of this embodiment respectively at the TELE position, the WIDE position, and the storage position. At the storage position, as shown in FIG. 13C, the flexible board 32 is disposed to extend through a gap between the outer periphery of the third cam barrel 17 and the recess 22e in the inner surface of the stationary barrel 22. The flexible board 32 is introduced to the exterior of the lens barrel unit while passing the slit hole 22g formed in the stationary barrel 22, the slit hole 23d formed in the rotating barrel 23, and the slit hole 35b formed in the cover member 35.

Figure 14:
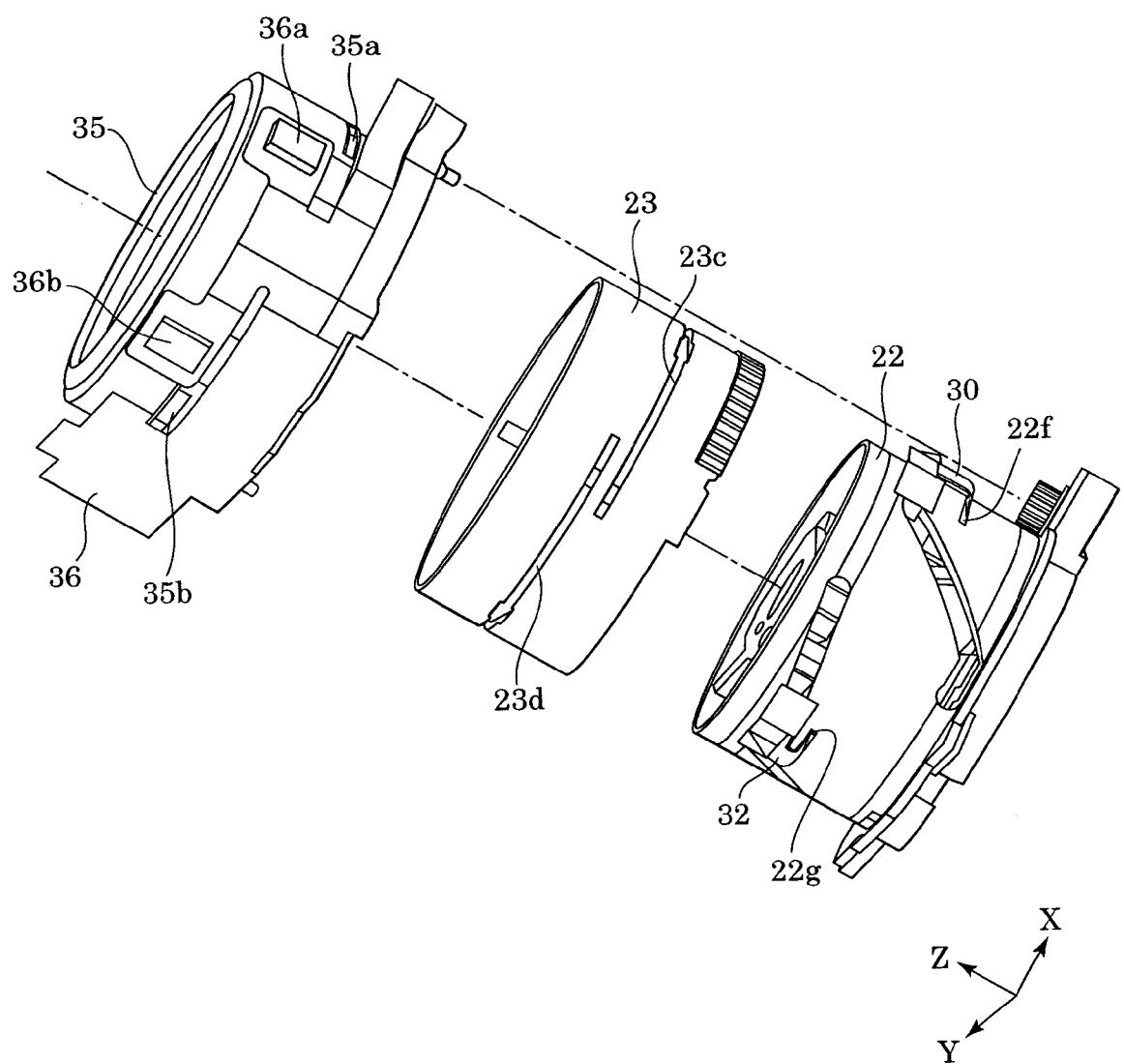
FIG. 14 is a perspective view showing the mounting structure of the flexible boards in the zoom lens barrel.
Figure 15:
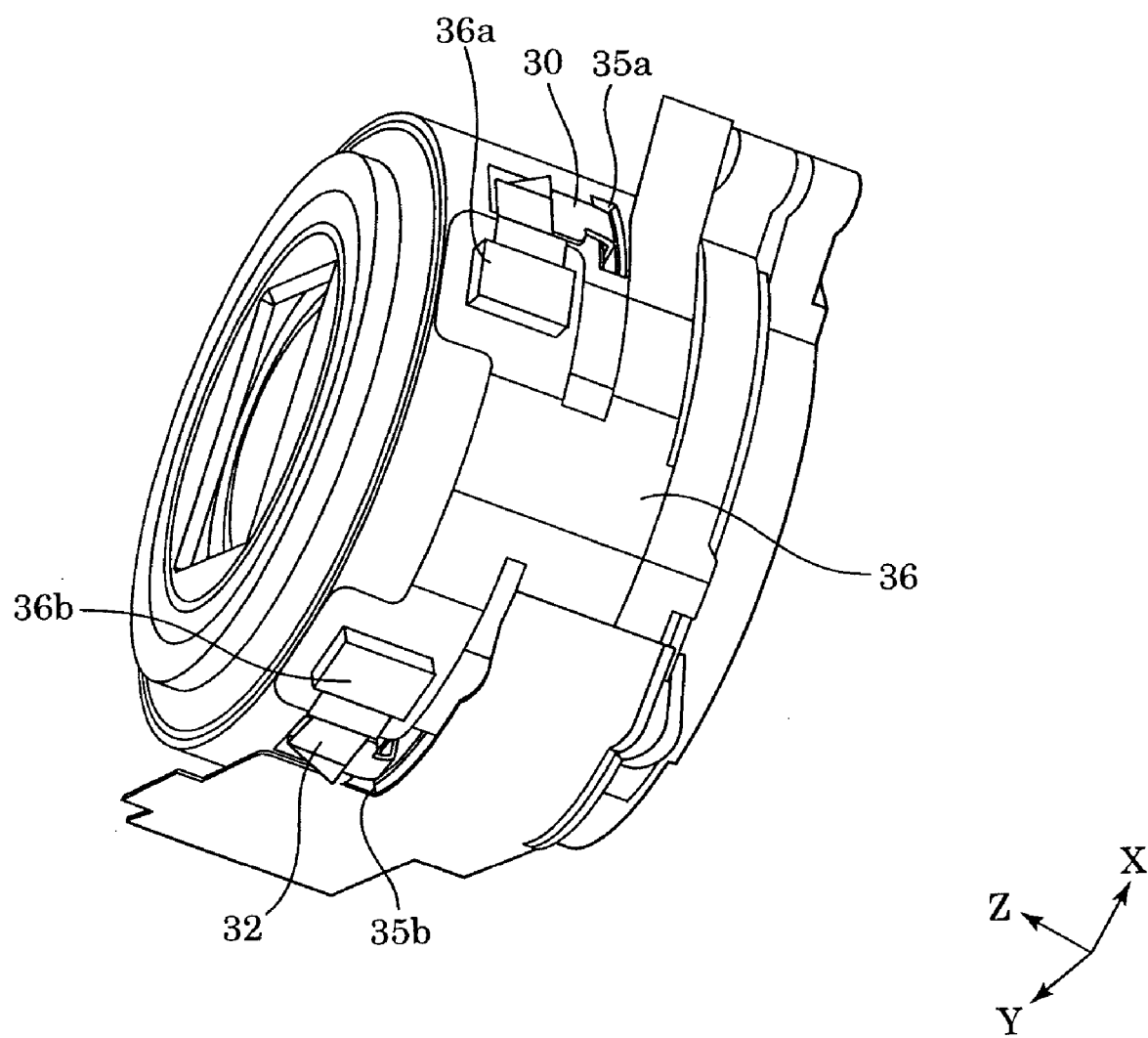
FIG. 15 is a perspective view showing the entirety of the zoom lens barrel after the flexible boards have been mounted in the zoom lens barrel.
Figure 16:
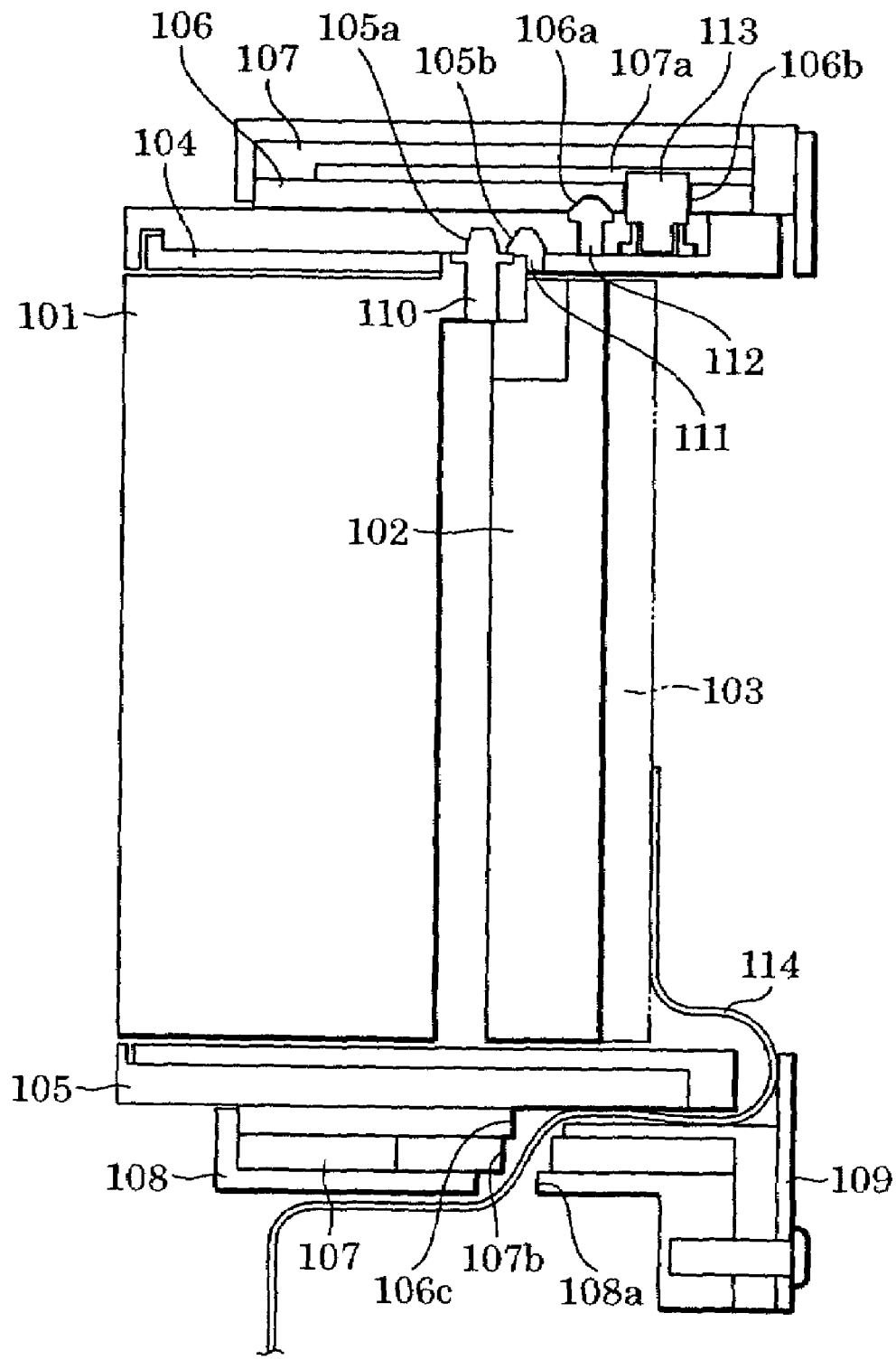
FIG. 16 is a schematic sectional view of a known zoom lens barrel.
Figure 17:
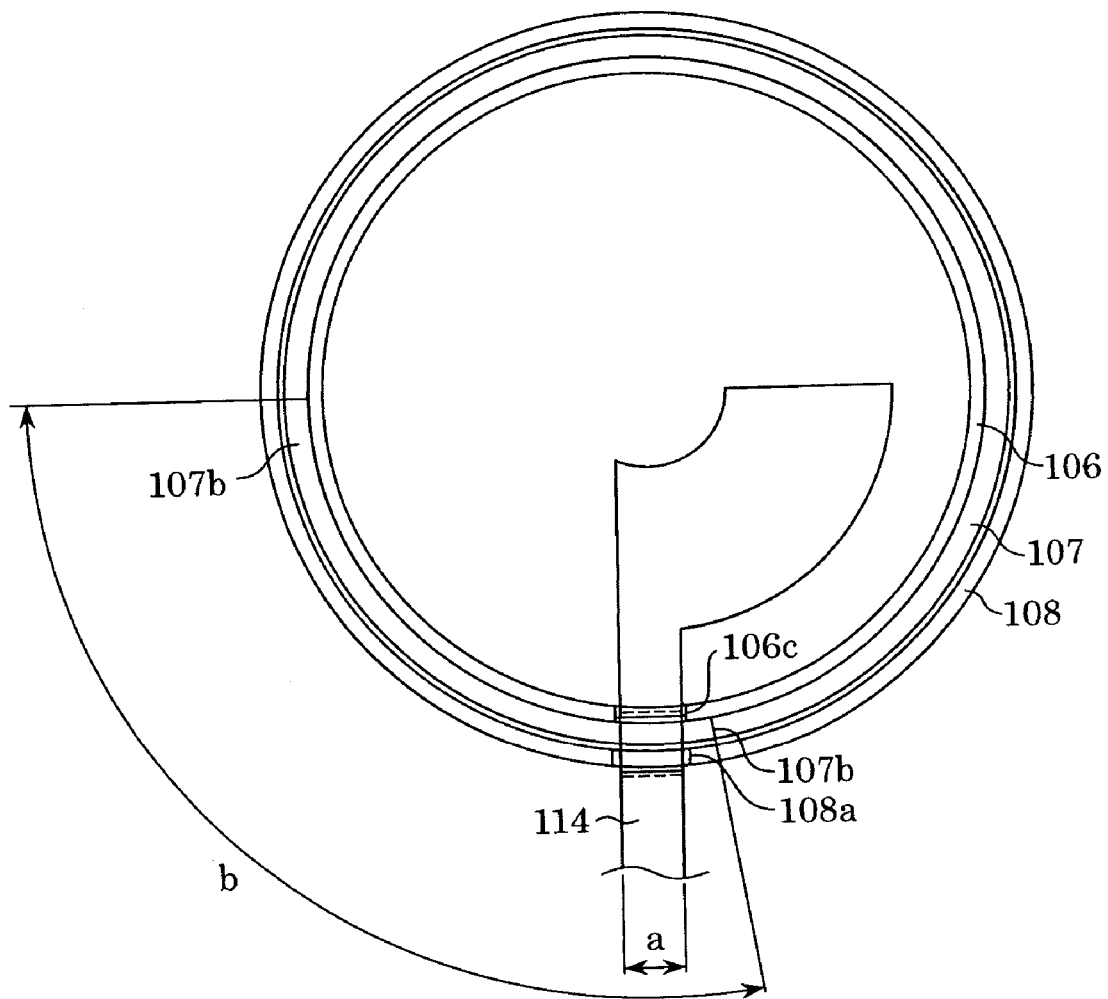
FIG. 17 is a schematic front view of the known zoom lens barrel.

FIG. 14 is a perspective view showing the mounting structure of the flexible boards 30, 32, and FIG. 15 is a perspective view showing the entirety of the zoom lens barrel after the flexible boards have been mounted. As also shown in FIGS. 14 and 15, the flexible boards 30, 32 having passed the slit holes 22f, 22g formed in the stationary barrel 22 are introduced to the exterior of the lens barrel unit after passing the slit holes 23c, 23d formed in the rotating barrel 23 and the slit holes 35a, 35b formed in the cover member 35, respectively. Then, the flexible board 30 is connected to a connector 36a of the connecting member 36 disposed on an outer periphery of the lens barrel unit, and the flexible board 32 is connected to a connector 36b of the connecting member 36 disposed on the outer periphery of the lens barrel unit. The connecting member 36 is connected to a not-shown connecting portion of the camera body.

As described above, in order to electrically connect the focusing unit 29 and the diaphragm and shutter unit 31, both disposed within the lens barrel, to the camera body (not shown), the flexible board 30 (connected to the focusing unit 29) and the flexible board 32 (connected to the diaphragm and shutter unit 31) are mounted such that the flexible boards 30, 32 are introduced to the exterior of the lens barrel while passing the slit holes 22f, 23c and 35a and the slit holes 22g, 23d and 35b formed in the stationary barrel 22, the rotating barrel 23, and the cover member 35, respectively. To that end, the slit holes 23c, 23d are formed in the rotating barrel 23 at different positions in the direction of the optical axis over a circumferential distance corresponding to the predetermined rotational angle of the rotating barrel 23. Accordingly, the strength of the rotating barrel 23 is ensured. Further, since the slit holes 23c, 23d are formed in overlapped relation to each other in the circumferential direction, the total angle over which the slit holes 23c, 23d extend circumferentially is reduced and the strength of the rotating barrel 23 is ensured in this point as well. In addition, since the flexible boards 30, 32 are disposed to extend through the respective gaps between the outer periphery of the third cam barrel 17 and the recesses 22d, 22e in the inner surface of the stationary barrel 22, the diameter of the lens barrel can be reduced.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2004-156360 filed May 26, 2004, which is hereby incorporated by reference herein.

What is claimed is:

1. A lens barrel for a camera including a camera body, comprising:
    a rotating barrel having a plurality of slit holes defined at different positions;
    a plurality of lens groups having an optical axis;
    actuators attached to one of the plurality of lens groups; and
    a plurality of flexible printed boards electrically connecting the actuators to the camera body,
    wherein the flexible printed boards are introduced to the camera body through the plurality of slit holes in a direction of the optical axis.

2. The lens barrel according to claim 1, wherein each slit hole is defined over a circumferential distance corresponding to a predetermined rotational angle of the rotating barrel.

3. The lens barrel according to claim 1, wherein the slit holes partly overlap with each other in a circumferential direction.

4. The lens barrel according to claim 1, wherein the lens barrel includes a stationary barrel and a plurality of moving barrels having cams and capable of telescopically advancing and retracting in the direction of the optical axis relative to the stationary barrel by a rotating force,
    wherein the stationary barrel and the moving barrels include recesses defined therein, and
    wherein the moving barrels are movable from a zoom area position to a storage position, and when the lens barrel is in the storage position, the flexible printed boards are introduced to an objective side respectively through gaps defined between the recesses of the stationary barrel and the adjacent moving barrel.

5. A camera including the lens barrel according to claim 1.

* * * * *